United States Patent
Adkisson et al.

(10) Patent No.: US 7,935,604 B2
(45) Date of Patent: May 3, 2011

(54) METHOD OF MAKING SMALL GEOMETRY FEATURES

(75) Inventors: James William Adkisson, Jericho, VT (US); Jeffrey Peter Gambino, Westford, VT (US); Robert Kenneth Leidy, Burlington, VT (US); Walter Victor Lepuschenko, Fairfax, VT (US); David Alan Meatyard, Bolton, VT (US); Stephen A. Mongeon, Essex Junction, VT (US); Richard John Rassel, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 673 days.

(21) Appl. No.: 12/028,847

(22) Filed: Feb. 11, 2008

(65) Prior Publication Data
US 2010/0279480 A1    Nov. 4, 2010

(51) Int. Cl.
*H01L 21/336* (2006.01)

(52) U.S. Cl. .................. 438/305; 257/E21.249

(58) Field of Classification Search .................. 438/305, 438/696, 674; 257/E21.249, E21.159, E21.409
See application file for complete search history.

(56) References Cited

U.S. PATENT DOCUMENTS

| 5,795,830 | A | 8/1998 | Cronin et al. |
|---|---|---|---|
| 5,885,425 | A * | 3/1999 | Hsieh et al. .............. 204/192.12 |
| 6,384,666 | B1 | 5/2002 | Bertin et al. |
| 6,949,458 | B2 | 9/2005 | Conrad et al. |
| 2009/0029556 | A1* | 1/2009 | Liao et al. ...................... 438/703 |
| 2009/0087993 | A1* | 4/2009 | Maxwell ....................... 438/703 |
| 2009/0283922 | A1* | 11/2009 | Rachmady et al. ........... 257/788 |

\* cited by examiner

*Primary Examiner* — Thao P. Le
(74) *Attorney, Agent, or Firm* — Schmeiser, Olsen & Watts; Richard M. Kotulak

(57) ABSTRACT

A method of forming a small geometry feature. The method includes forming a source layer on a top surface of a substrate; forming a mandrel on a top surface of the source layer, the mandrel having a sidewall; sputtering material from the source layer onto the sidewall of the mandrel to form a sidewall layer on the sidewall of the mandrel; and removing the mandrel. Also methods to forming wires and field effect transistors of integrated circuits.

25 Claims, 8 Drawing Sheets

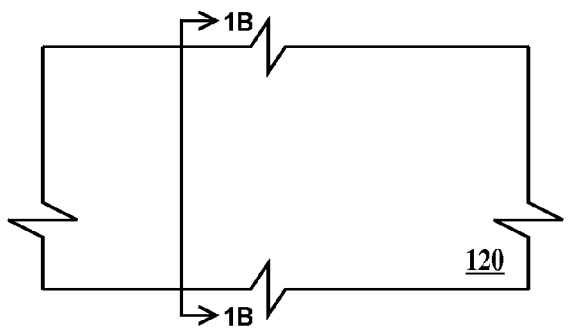
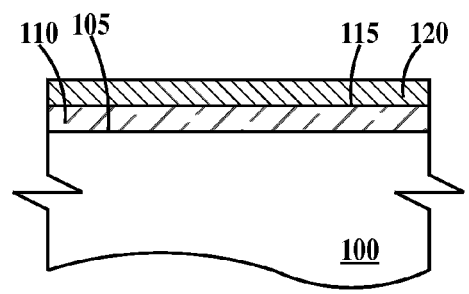
*FIG. 1A*  *FIG. 1B*
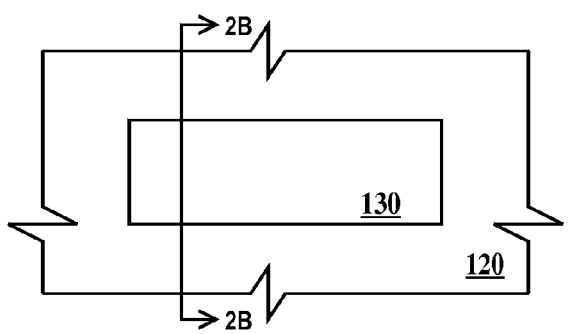
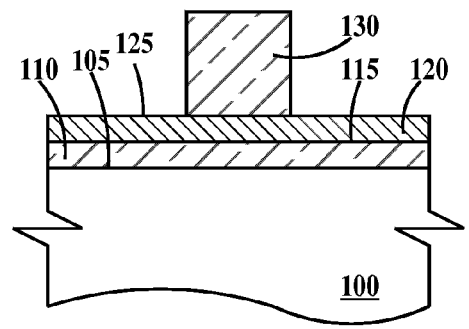
*FIG. 2A*  *FIG. 2B*
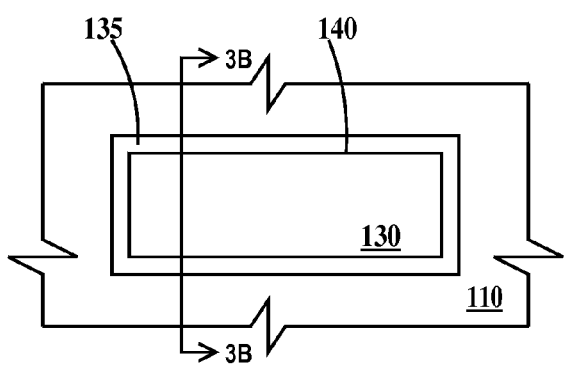
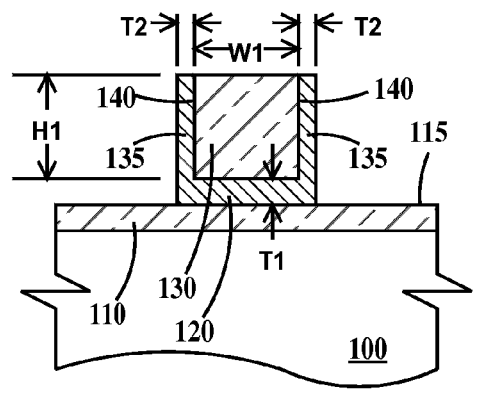
*FIG. 3A*  *FIG. 3B* ed US 7,935,604 B2

METHOD OF MAKING SMALL GEOMETRY FEATURES

FIELD OF THE INVENTION

The present invention relates to methods for forming small geometry features that potentially have sub-lithographic dimensions and more particularly to methods of forming sidewall layers having potentially sub-lithographic dimensions and to methods of forming devices having potentially sub-lithographic dimensions.

BACKGROUND OF THE INVENTION

Fabrication of micro and nano scale structures including those used in integrated circuits, is limited by the resolution of the lithography process used to define the dimensions of the feature as well as by the physical and chemical properties of the materials the features are to be fabricated from. For example, sidewall image transfer techniques, which can form features having sub-lithographic dimensions, are not compatible with non-volatile materials. In another example, many materials are difficult or impossible to deposit in conformal layers so conventional spacer processes cannot be used. In other cases, the methods of fabricating features having sub-lithographic dimensions require expensive equipment or are very time-consuming. Accordingly, there exists a need in the art to overcome the deficiencies and limitations described hereinabove.

SUMMARY OF THE INVENTION

A first aspect of the present invention is a method, comprising: forming a source layer on a top surface of a substrate; forming a mandrel on a top surface of the source layer, the mandrel having a sidewall; sputtering material from the source layer onto the sidewall of the mandrel to form a sidewall layer on the sidewall of the mandrel; and removing the mandrel.

A second aspect of the present invention is the first aspect, further including: removing any remaining source layer not protected by the sidewall layer.

A third aspect of the present invention is the second aspect, further including: etching a pattern into the substrate where the substrate is not protected by the sidewall layer; and removing the sidewall layer.

A fourth aspect of the present invention is the first aspect, wherein, after the sputtering material from the source layer a thinned layer of source layer remains on the top surface of the substrate adjacent to the sidewall layer.

A fifth aspect of the present invention is the first aspect, wherein the sidewall of the mandrel is about perpendicular to the top surface of the substrate.

A sixth aspect of the present invention is the first aspect, wherein the sidewall of the mandrel is within about 10° of perpendicular to the top surface of the substrate.

An seventh aspect of the present invention is the first aspect, wherein a width of the sidewall layer measured perpendicularly from the sidewall of the mandrel is a sub-lithographic dimension.

An eighth aspect of the present invention is the first aspect, wherein: the source layer comprises a lower layer on the top surface of the substrate and an upper layer on a top surface of the lower layer; and the sidewall layer comprises a first layer on the sidewall of the mandrel and a second layer on the first layer, the first layer comprising a first same material as the upper layer and the second layer comprising a second same material as the lower layer.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

FIGS. 1A, 2A and 3A are top views and FIGS. 1B, 2B and 3B are cross-section views through respective lines 1B-1B, 2B-2B and 3B-3B of FIGS. 1A, 2A and 3A of initial fabrication steps of embodiments of the present invention;

DETAILED DESCRIPTION OF THE INVENTION

Figure 3C:
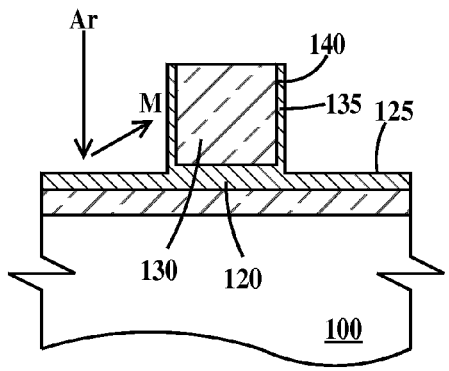
FIG. 3C is a cross-section through line 3B-3B of FIG. 3A, illustrating the mechanism for forming features according to embodiments of the present invention.

A sub-lithographic dimension is defined as a dimension of structure formed on a substrate, measured in a direction parallel to a top surface of the substrate, that is smaller than a dimension of a smallest printable feature generated by actinic radiation striking a photoresist layer in an optical photolithographic process. Alternatively a sub-lithographic dimension is defined as a dimension of about 30 nm or less.

FIGS. 1A, 2A and 3A are top views and FIGS. 1B, 2B and 3B are cross-section views through respective lines 1B-1B, 2B-2B and 3B-3B of FIGS. 1A, 2A and 3A of initial fabrication steps of embodiments of the present invention. In FIGS. 1A and 1B, a substrate 100 has a top surface 105. Formed on a top surface 105 of substrate 100 is an optional base layer 110. Formed on a top surface 115 of base layer 115 is a source layer 120. In one example, substrate 100 is a semiconductor substrate. In one example substrate 100 comprises silicon, germanium, a combination of silicon and germanium, or gallium arsenide. In one example, substrate 100 includes semiconductor devices such as field effect transistor, (FETs), bipolar transistors, diodes, resistor and capacitors. In one example, base layer 110 comprises a dielectric layer and source layer 120 is a metal layer. In one example base layer 110 is silicon dioxide ($SiO_2$), silicon nitride ($Si_3N_4$), silicon carbide (SiC), silicon oxy nitride (SiON), silicon oxy carbide (SiOC), organosilicate glass (SiCOH), plasma-enhanced silicon nitride ($PSiN_x$) or NBLok (SiC(N,H)). In one example, source layer 120 comprises titanium (Ti), tantalum (Ta), platinum (Pt), tungsten (W), chrome (Cr), cobalt (Co), nickel (Ni), palladium (Pd), gold (Au), silver (Ag), cadmium (Cd), aluminum (Al), silicon (Si), tin (Sn) or combinations thereof In one example, source layer 120A comprises a sputterable dielectric material. In one example, source layer 120A comprises a sputterable dielectric material that also acts a diffusion barrier such as silicon carbide (SiC), silicon carbonitride (SiCN) and silicon nitride ($Si_3N_4$). In one example, source layer 120A comprises a sputterable piezoelectric material such as, but not limited to, zinc oxide.

In FIGS. 2A and 2B, a mandrel 130 is formed on a top surface 125 of source layer 120. In one example mandrel 130 is a photoresist island formed by forming a layer of photoresist on top surface 125 of source layer 130, exposing the photoresist layer to actinic radiation through a patterned photomask (or by direct write, such as in an e-beam lithography tool), and developing away the exposed portions of the photoresist layer (in the case of a positive photoresist) or developing away the unexposed portions of the of the photoresist layer (in the case of a negative photoresist).

In FIGS. 3A and 3B, a sputtering process has been performed to remove source layer 120 from top surface 115 of base layer 110 where the source layer is not covered by mandrel 130 and re-deposit the material of the source layer as sidewall layers 135 on sidewalls 140 of the mandrel. In one example, sidewalls 140 of mandrel 130 are perpendicular to top surface 105 (see FIG. 2B) of substrate 100. In one example, sidewalls 140 of mandrel 130 are about perpendicular to top surface 105 (see FIG. 2B) of substrate 100. In one example, sidewalls 140 of mandrel 130 are within about 10° of being perpendicular to top surface 105 (see FIG. 2B) of substrate 100. In a sputter process argon (Ar) (or other atoms) are converted to ions in a plasma and accelerated to a target (in this case source layer 120) by a DC bias applied between the plasma and the target (e.g. source layer 120). An exemplary sputter process is run at a pressure of about between about 0.1 to about 100 millitorr (about 10 millitorr preferred), a power of about 50 to about 200 watts (about 50 watts preferred) and a DC bias of between about 10 to about 1000 volts (about 100 volts preferred). Alternative means to DC sputtering may be used, such as atomic beam sputtering which uses neutral argon atoms (or other neutral atoms) instead of ions. Source layer 120 has a thickness T1, mandrel 130 has a height H1 and a width W1, and sidewall layers 135 have a maximum thickness of T2. In one example H1 is between about 100 rim and about 2000 nm. In one example, W1 is the smallest dimension that may be produced by the photolithographic process used to define mandrel 130. T2 is less than W1. W2 is a sub-lithographic dimension. In one example T2 is between about 1 nm and about 100 run. In one example T2 is between about 5 nm and about 10 rim.

FIG. 3C is a cross-section through line 3B-3B of FIG. 3A, illustrating the mechanism for forming features according to embodiments of the present invention. In FIG. 3C, a sputtering species, (e.g., Ar ions) strike source layer 120 and sputter off the material of source layer 120 (e.g., metal atoms (M)) to form sidewall layers 135. The closer to perpendicular (relative to top surface 105 of substrate 100) the sputtering species strikes the source layer, the less likely it becomes for material sputtered onto sidewalls 140 of mandrel 130 to be re-sputtered off The further from perpendicular (relative to top surface 105 of substrate 100) the sputtering species strikes the source layer, the more likely it becomes for material sputtered onto sidewalls 140 of mandrel 130 to be re-sputtered off.

Figure 3D:
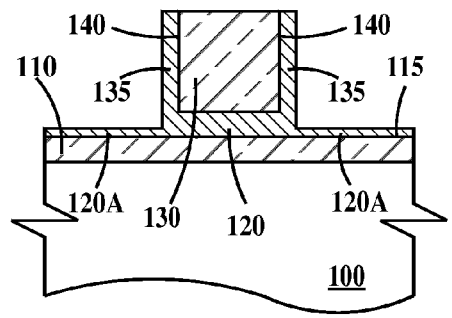
FIG. 3D is a cross-section through line 3B-3B of FIG. 3A, illustrating an alternative structure to that of FIG. 3B.
Figure 3E:
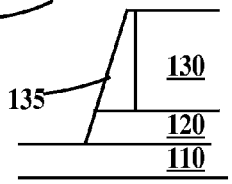
FIG. 3E illustrates that the sidewall layer of the present invention may be tapered.

FIG. 3D is a cross-section through line 3B-3B of FIG. 3A, illustrating an alternative structure to that of FIG. 3B. While in FIG. 3B, all of source layer 120, not protected by mandrel 130 (or sidewall layers 135, as they are formed) is removed, a thin layer 120A may be left, which may be removed at a later time by, for example, reactive ion etch (RIE). Leaving thin layer 120A would be useful, for example, for conducting subsequent plating processes when source layer 120 is electrically conductive or to protect base layer 110 from subsequent processing steps.

FIG. 3F illustrates that the sidewall layer of the present invention may be tapered. In FIG. 3F, sidewall layer 135 is wider near the bottom of mandrel 130 (that closest to base layer 110) and tapers to be narrower near the top of mandrel 130.

Figure 4A:
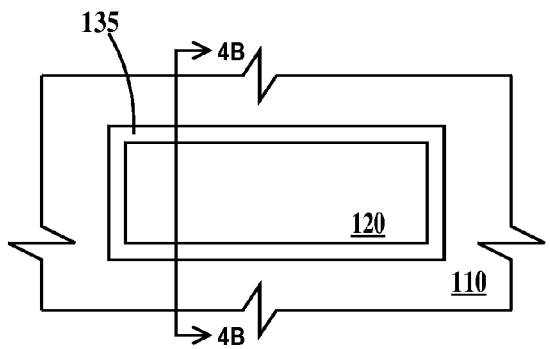
FIGS. 4A and 5A are top views and FIGS. 4B and 5B are cross-section views through respective lines 4B-4B and 5B-5B of FIGS. 4A and 5A of continuing fabrication steps of embodiments of the present invention.
Figure 4B:
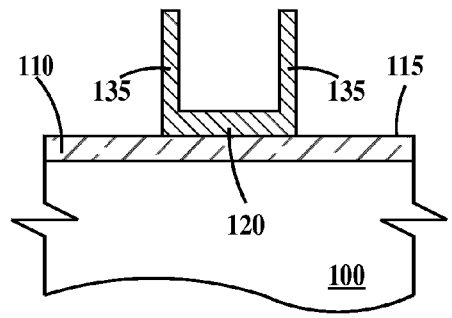
Figure 5A:
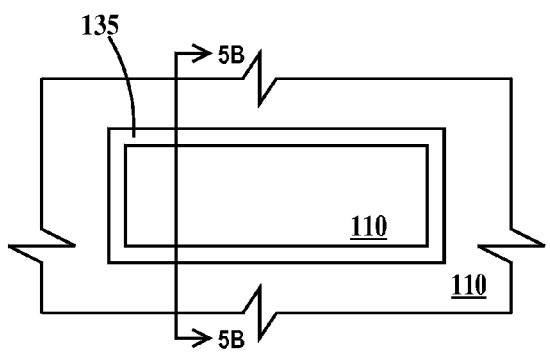
Figure 5B:
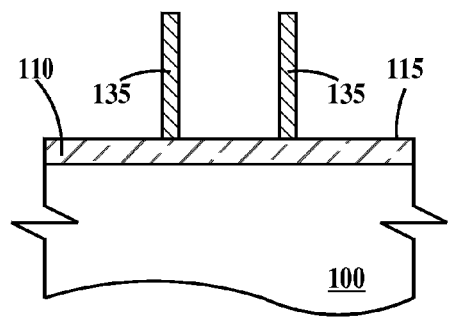

FIGS. 4A and 5A are top views and FIGS. 4B and 5B are cross-section views through respective lines 4B-4B and 5B-5B of FIGS. 4A and 5A of continuing fabrication steps of embodiments of the present invention. In FIGS. 4A and 4B, mandrel 130 (see FIGS. 3A and 3B) is removed. When mandrel 130 is photoresist, the mandrel may be removed using acid and/or solvents. A region of source layer 120 remains between and under sidewall layers 135, having been protected from the sputtering process by mandrel 130.

In FIGS. 5A and 5B, remaining source layer 120 (see FIG. 4B) and remaining thinned source layer 120A (see FIG. 3D) not protected by sidewall layers 135 is removed by, for example, sputter etching, RIE, or wet etching.

Figure 6A:
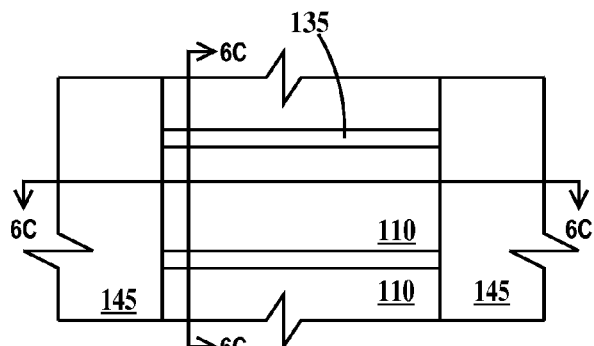
FIGS. 6A and 7A are top views and FIGS. 6B, 6C and 7B (and 7C) are cross-section views through respective lines 6B-6B, 6C-6C and 7B-7B of FIGS. 6A and 7A illustrating additional optional processing steps according to embodiments of the present invention.
Figure 6B:
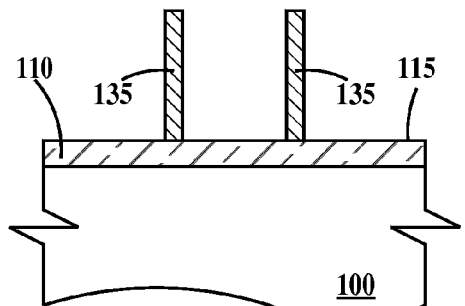
Figure 6C:
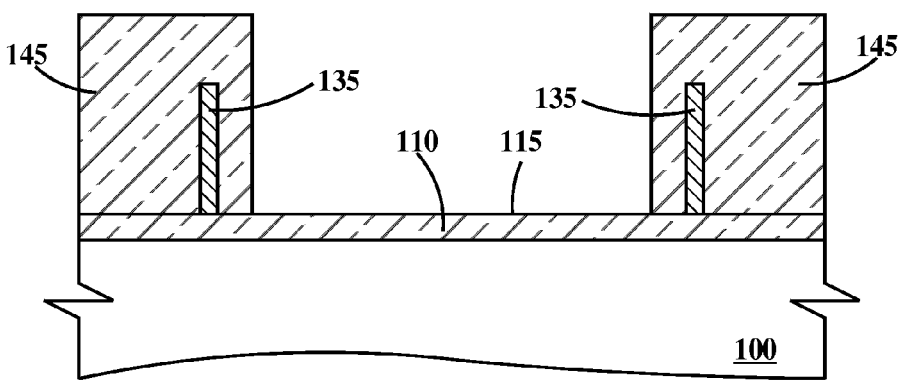
Figure 7A:
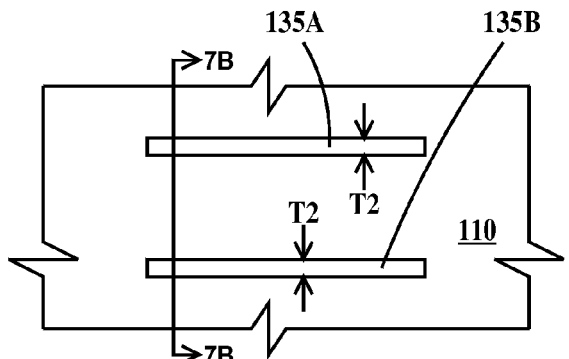
Figure 7B:
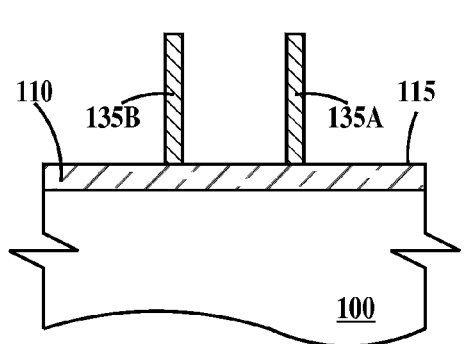

FIGS. 6A and 7A are top views and FIGS. 6B, 6C and 7B (and 7C) are cross-section views through respective lines 6B-6B, 6C-6C and 7B-7B of FIGS. 6A and 7A illustrating additional optional processing steps according to embodiments of the present invention. It will be noted that in FIG. 5A, sidewall layer 135 is in the form of a closed loop. In FIGS. 6A, 6B and 6C, a patterned masking layer 145 (e.g., photoresist) is formed over some regions of the loop of sidewall layer 135 but not others. In FIGS. 7A and 7B, the regions of exposed sidewall layer 135 not protected by patterned masking layer 145 (see FIGS. 6A and 6C) have been removed by, for example, by wet or RIE etching, and then the patterned masking layer removed as well to form nano-structures 135A and 135B having widths T2. If nano-structures 135A and 135B are electrically conductive, they may be used as nanowires in the wiring levels of integrated circuits and may be connected to devices (not shown but described supra) in substrate 100 by electrically conductive vias (not) shown through base layer 110 when base layer 110 is a dielectric.

Figure 7C:
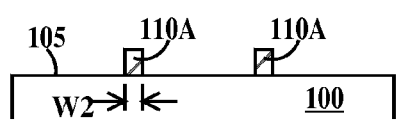

In FIG. 7C, nano-structures 135A and 135B (see FIG. 7B) have been used as hard masks to etch base layer 110 and then removed to form islands 110A. Islands 110A have a width W2, where W2 is a sub-lithographic dimension. Sidewall layers 135 of FIGS. 5A and 5B may similarly be used as a hardmask for etching base layer 110.

Figure 8A:
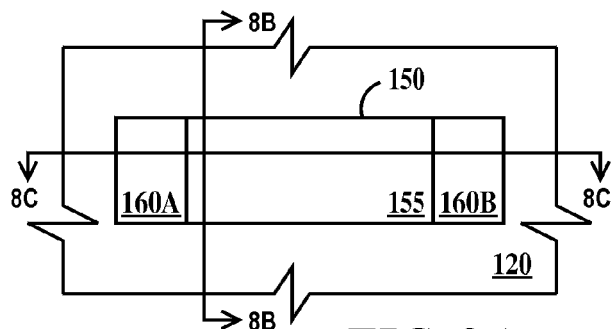
FIG. 8A is a top view and FIGS. 8B and 8C are cross-section views through respective lines 8B-8B and 8C-8C of FIG. 8A illustrating an alternative processing step to that illustrated in FIGS. 2A and 2B.
Figure 8B:
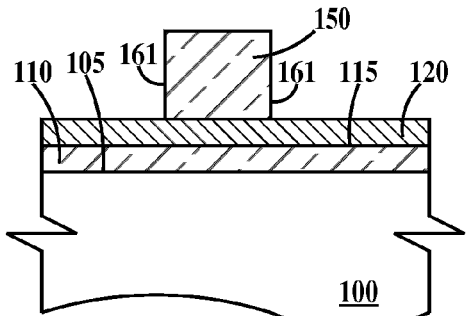
Figure 8C:
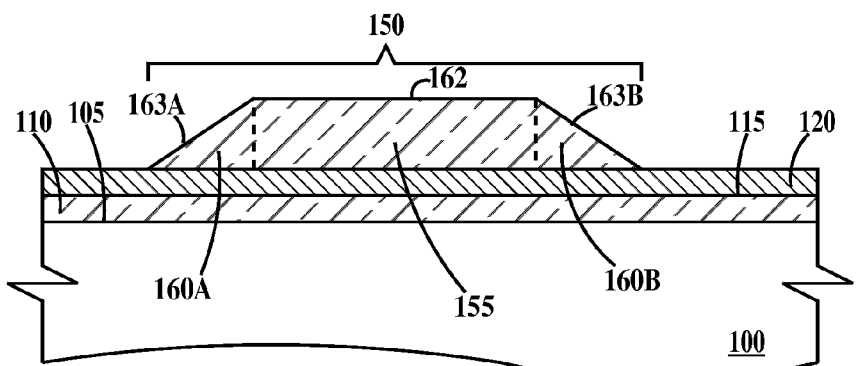

FIG. 8A is a top view and FIGS. 8B and 8C are cross-section views through respective lines 8B-8B and 8C-8C of FIG. 8A illustrating an alternative processing step to that illustrated in FIGS. 2A and 2B. In FIGS. 8A, 8B and 8C, a photoresist mandrel 150 comprises a central region 155 of uniform thickness and integral opposite tapered end regions 160A and 160B. Tapered end regions 160A and 160B are thickest where they join central region 155 and thinnest away from central region 155. Photoresist mandrel 150 may formed by exposing a photoresist layer to actinic radiation through a patterned haft-tone photomask, the half tone portion of the mask image corresponding to tapered regions 160A and 160B. While material sputtered from source layer 120 will deposit on sidewalls 161 of mandrel 150, any material deposited on top surface 162 of central region 155 or top surfaces 163A and 163B of tapered regions 160A and 160B will be re-sputtered away so there is little to no net deposition of layer 120 material on these surfaces.

Figure 9:
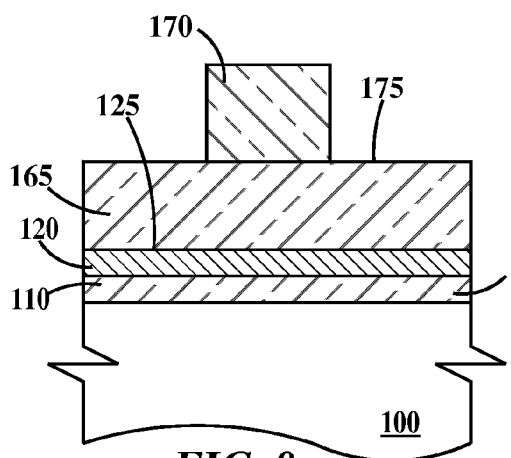
FIGS. 9 and 10 are cross-sections illustrating a method of forming a hard mandrel according to embodiments of the present invention.
Figure 10:
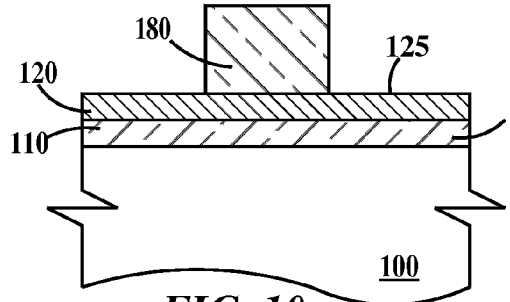

FIGS. 9 and 10 are cross-sections illustrating a method of forming a hard mandrel according to embodiments of the present invention. In FIG. 9, a hardmask layer 165 is formed on top surface 125 of source layer 120 and a patterned photoresist layer 170 formed on a top surface 175 of hardmask layer 165. In FIG. 10, hardmask layer 165 (see FIG. 9) has been removed where the hardmask layer was not protected by photoresist layer 170 (see FIG. 9) to form a hard mandrel 180. Hard mandrel may replace mandrel 130 described supra.

Figure 11:
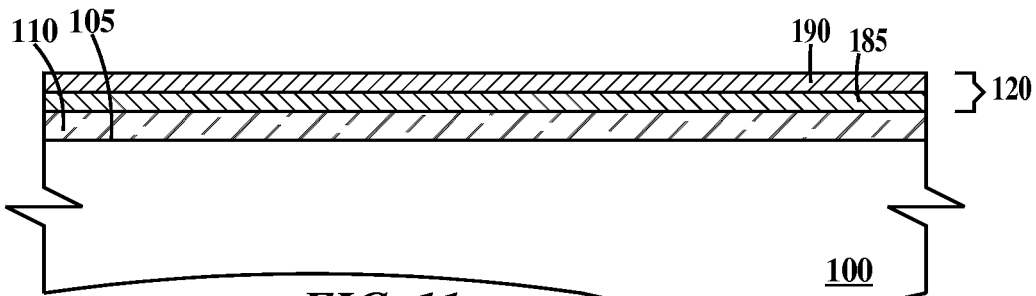
FIGS. 11 through 14 are cross-sections illustrating a method of forming a multilayer nano structure according to embodiments of the present invention.

FIGS. 11 through 14 are cross-sections illustrating a method of forming a multilayer nano structure according to embodiments of the present invention. FIG. 11 differs from FIG. 1B in that source layer 120 comprises a lower layer 185 on base layer 110 and an upper layer 190 on lower layer 185. In one example, lower layer 185 and upper layer 190 are dependently Ti, Ta, Pt, W, Cr, Co, Ni, Pd, Au, Ag, Cd, Al, Si, Sn, sputterable dielectric materials such as SiC, SiCN, $S_3N_4$, a piezoelectric material, zinc oxide or combinations thereof. That is, lower layer 185 and upper layer 190 cannot consist of the same materials or lower layer 185 and upper layer 190 can consist of the same materials, but not in the same proportions.

Figure 12:
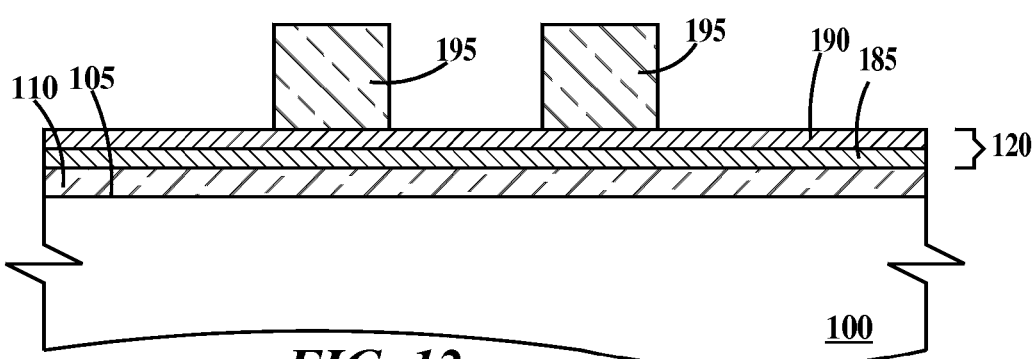

In FIG. 12, mandrels 195 have been formed. Mandrels 195 may be similar to mandrel 130 of FIG. 2B, to mandrel 150 of FIG. 8C or mandrel 180 of FIG. 10.

Figure 13:
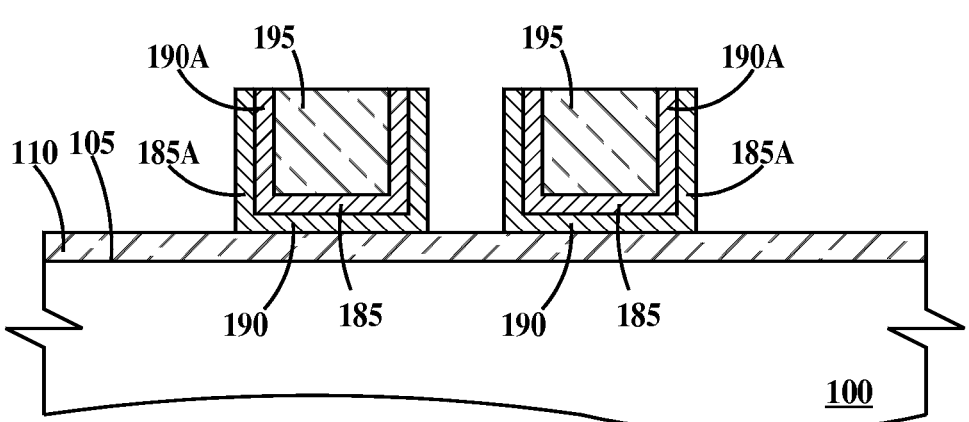
Figure 14:
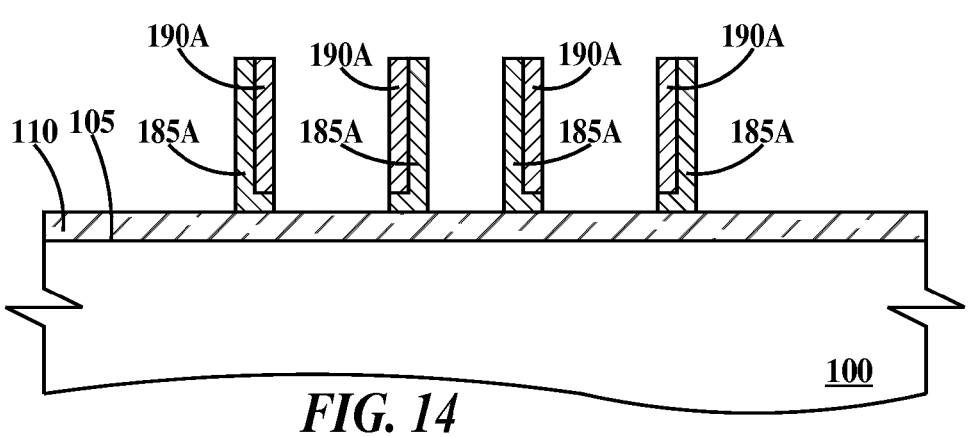

In FIG. 13, after a sputtering process (as described supra) a layer 190A derived from upper layer 190 is formed on the sidewalls of mandrel 195 and a layer 185A derived from lower layer 185 is formed on layer 190A. The structures of FIG. 13 may be further processed to remove mandrel 195 and still further processed to remove remaining layers 185 and 190 previously protected by mandrel 195 to result in the structure of FIG. 14.

Alternatively layer 120 (see FIG. 11) may consist of three or more layers resulting in a corresponding number of layers formed on the sidewalls of mandrel 195 of FIG. 13.

Figure 15:
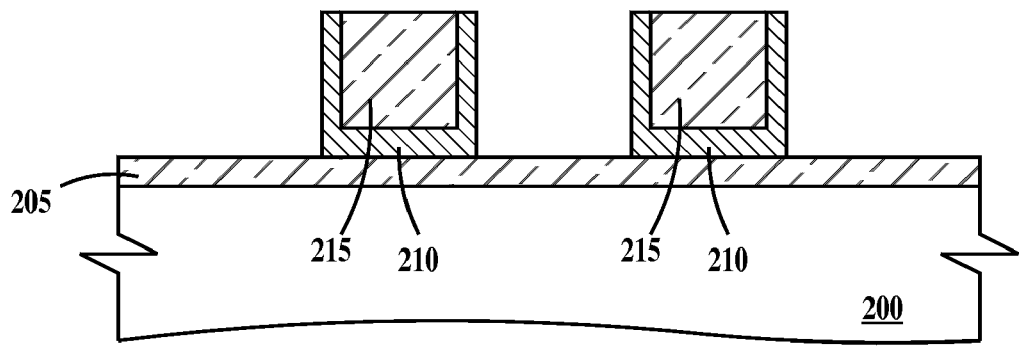
FIGS. 15 through 21 are cross-sections illustrating a method of forming a damascene wires according to embodiments of the present invention.

FIGS. 15 through 21 are cross-sections illustrating a method of forming a damascene wires according to embodiments of the present invention. In FIG. 15, substrate 200 is similar to substrate 100 of FIG. 1B and base layer 205 is similar to base layer 110 of FIG. 1B. An electrically conductive liner 210 is formed under and on the sidewalls of a mandrel 215. Conductive liner 210 is formed by forming mandrel 215 on a source layer and sputtering the source layer to re-deposit on the sidewalls of the mandrel to form the liner according to any of the embodiments taught supra. In one example, liner 210 comprises one or more layers selected from the group consisting of W, Ti, Ta, titanium nitride (TiN) and tantalum nitride (TaN).

Figure 16:
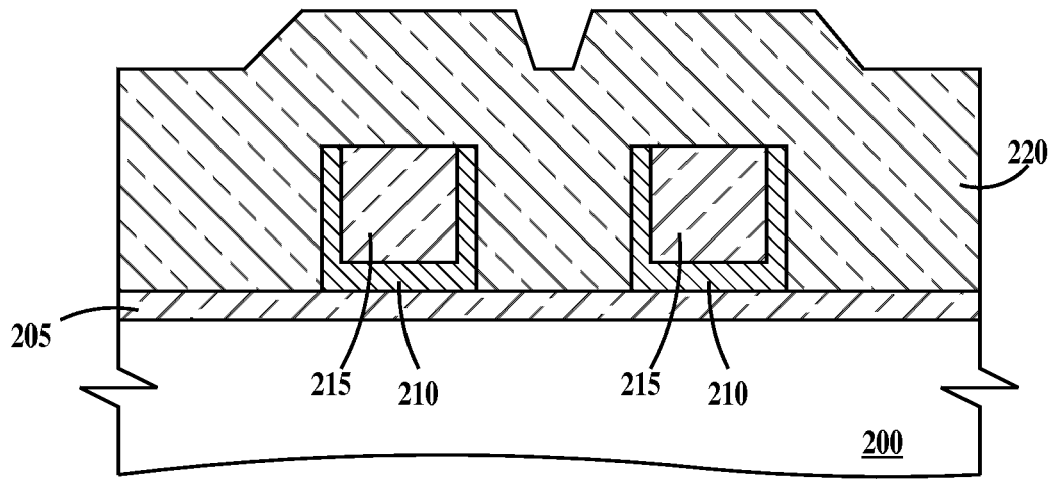

In FIG. 16, an interlevel dielectric layer (ILD) 220 is formed of sufficient thickness to completely fill in the spaces between the mandrel 210/liner 215 structures. In one example, ILD layer 220 is a low K (dielectric constant) material, examples of which include but are not limited to hydrogen silsesquioxane polymer (HSQ), methyl silsesquioxane polymer (MSQ), SiLK™ (polyphenylene oligomer) manufactured by Dow Chemical, Midland, TX, Black Diamond™ (methyl doped silica or $SiO_x(CH_3)_y$ or $SiC_xO_yH_y$ or SiOCH) manufactured by Applied Materials, Santa Clara, CA, organosilicate glass (SiCOH), and porous SiCOH. In one example, ILD layer 220 is between about 300 nm and about 2,000 nm thick. A low K dielectric material has a relative permittivity of about 2.4 or less.

Figure 17:
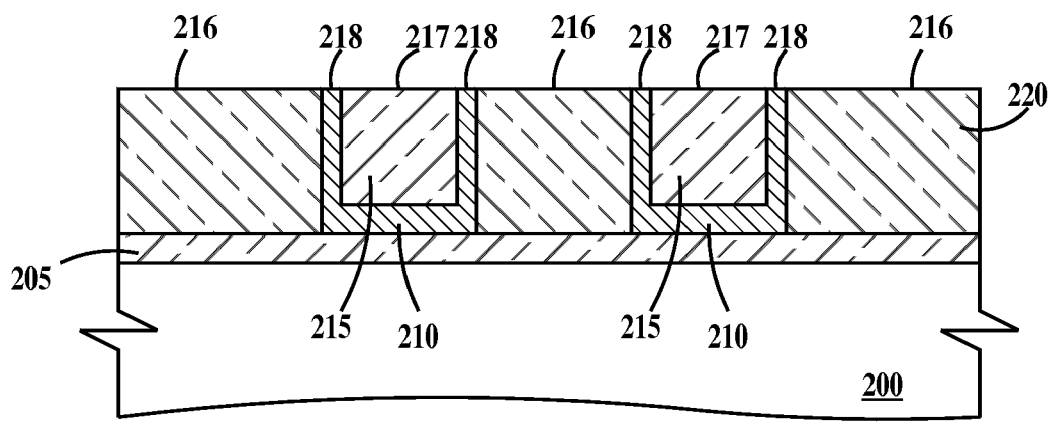
Figure 18:
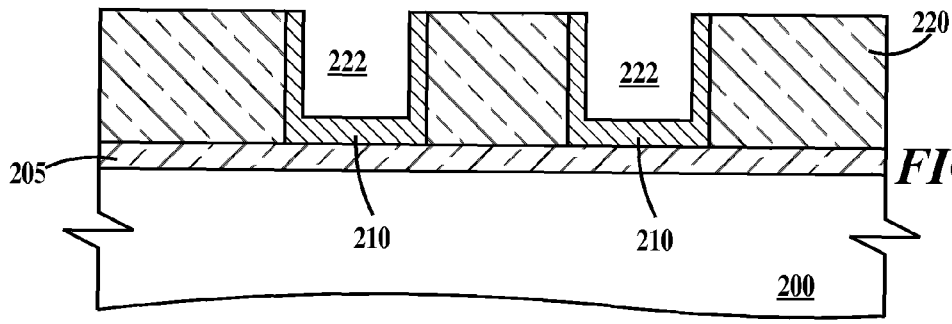

In FIG. 17, a chemical-mechanical polish (CMP) has been performed to that top surfaces 216 of ILD 220, top surfaces 217 of mandrel 215 and edges 218 of liner 210 are coplanar and in FIG. 18, mandrels 215 are removed leaving trenches 222.

Figure 19:
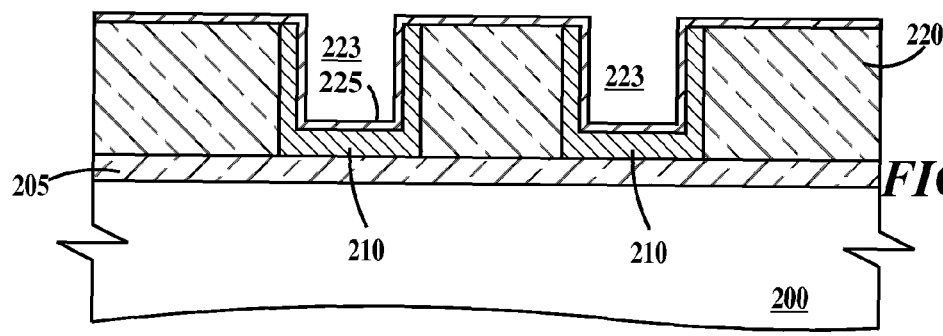
Figure 20:
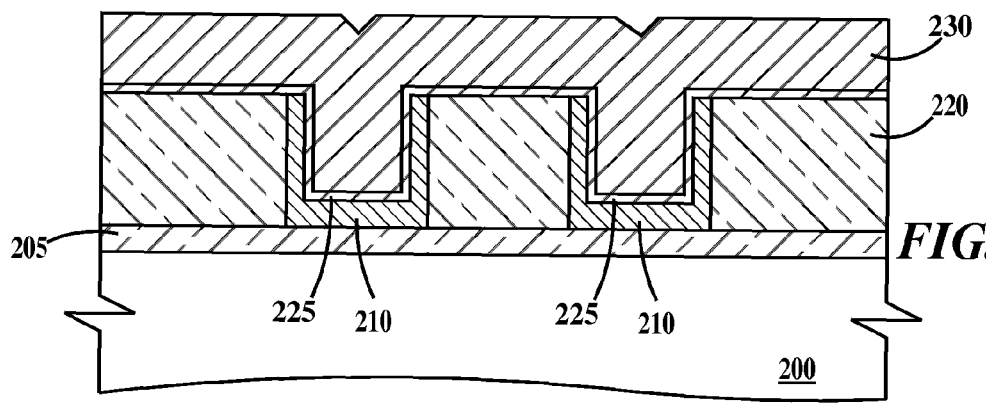

In FIG. 19, a copper seed layer 225 is deposited on all exposed surfaces of ILD 220 and liners 210 leaving trenches 223. In FIG. 20, a copper layer 230 is electroplated onto seed layer 225. Copper layer 230 is of sufficient thickness to completely fill trench 223 (see FIG. 19).

Figure 21:
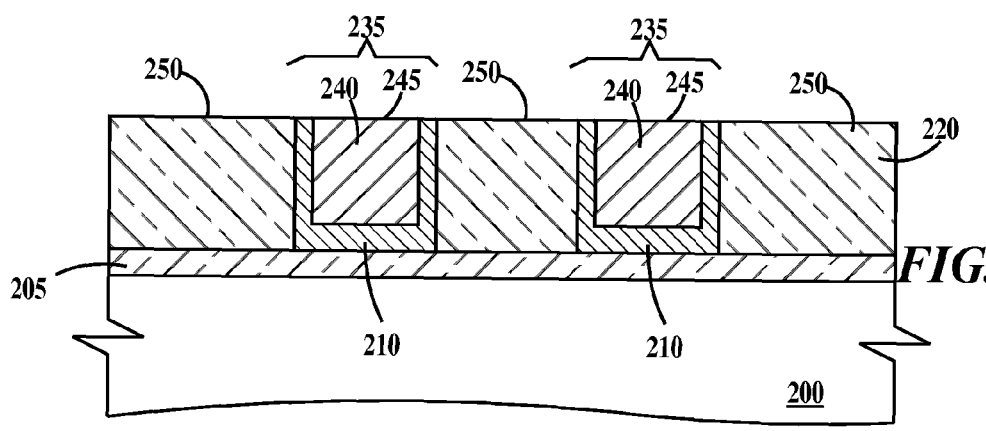

In FIG. 21, a CMP is performed to form damascene wires 235 comprised of liners 210 and core conductors 240. Top surfaces 245 of wires 235 are coplanar with a top surface 250 of ILD layer 220.

Alternatively, trenches 222 of FIG. 18 may be filled by deposition or evaporation of an electrical conductor and a CMP performed to arrive at a structure similar to that of FIG. 21 directly.

Figure 22:
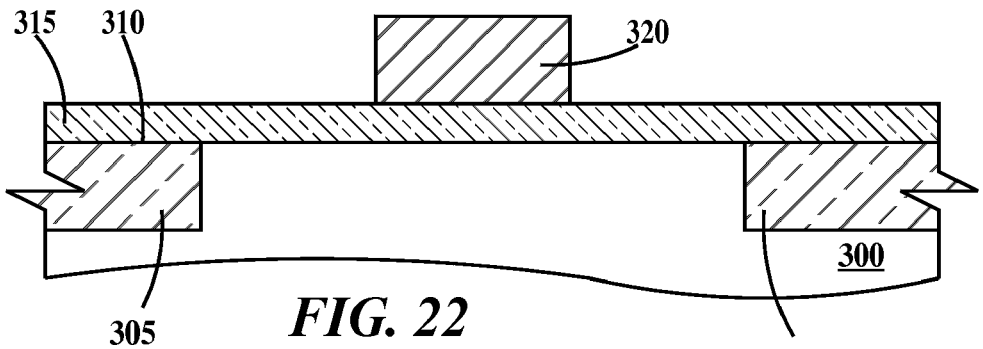
FIGS. 22 through 25 are cross-sections illustrating a method of forming a field effect transistors according to embodiments of the present invention.

FIGS. 22 through 25 are cross-sections illustrating a method of forming a field effect transistors according to embodiments of the present invention. In FIG. 22, substrate 300 is similar to substrate 100 of FIG. 1B and includes shallow trench isolation (STI) 305 extending from a top surface 310 of substrate 300 into the substrate. A dielectric layer 315 is formed on top surface 310 of substrate 300 and on STI 305. An electrically conductive mandrel 320 is formed on dielectric layer 315 according to any of the embodiments taught supra. In one example dielectric layer 315 is a high K (dielectric constant) material, examples of which include but are not limited metal oxides such as $Ta_2O_5$, $BaTiO_3$, $HfO_2$, $ZrO_2$, $Al_2O_3$, or metal silicates such as $HfSi_xO_y$ or $HfSi_xO_yN_z$ or combinations of layers thereof. A high K dielectric material has a relative permittivity above about 10. In one example, dielectric layer 315 is about 0.5 nm to 20 nm thick. In one example, mandrel 320 comprises polysilicon or doped polysilicon.

Figure 23:
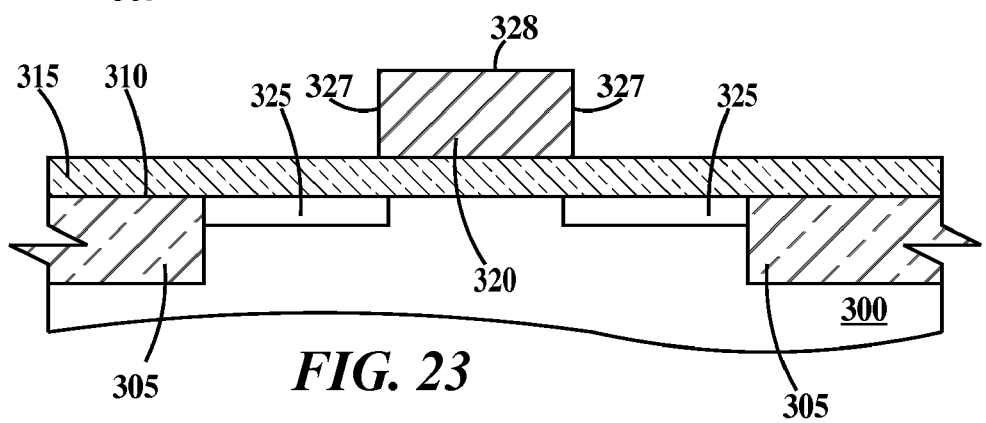

In FIG. 23, a first ion implantation of a first dopant species is performed to form first doped regions 325 in substrate 300. A portion of the perimeters of first doped regions 325 abut STI 305 and remaining portions of the perimeters of first doped regions 325 are essentially aligned (before any anneal steps and disregarding ion implantation straggle) to sidewalls 327 of mandrel 320. The first ion implantation may penetrate into mandrel 320 or mandrel 320 may including a capping layer (not shown) on a top surface 328 of the mandrel that blocks the first dopant species from penetrating into the mandrel.

Figure 24:
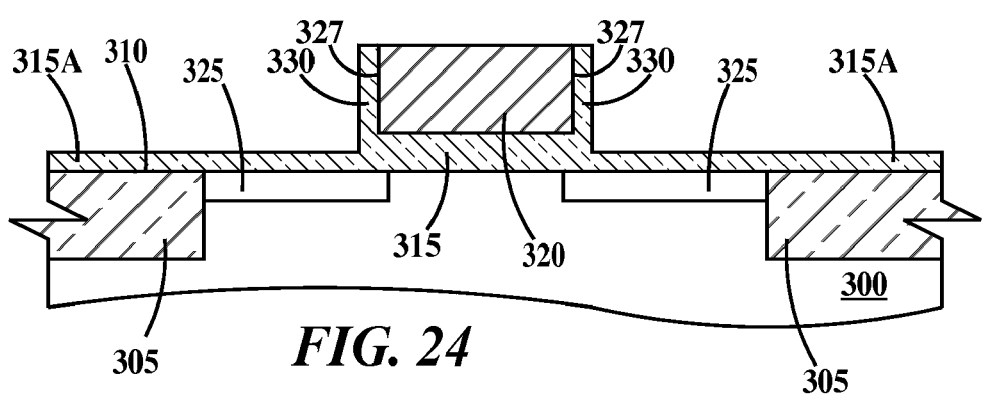

In FIG. 24, dielectric sidewall layers 330 are formed on sidewalls 327 of mandrel 320. Thinned regions 315A of dielectric layer 315 optionally remain over STI 305 and first doped regions 325.

Figure 25:
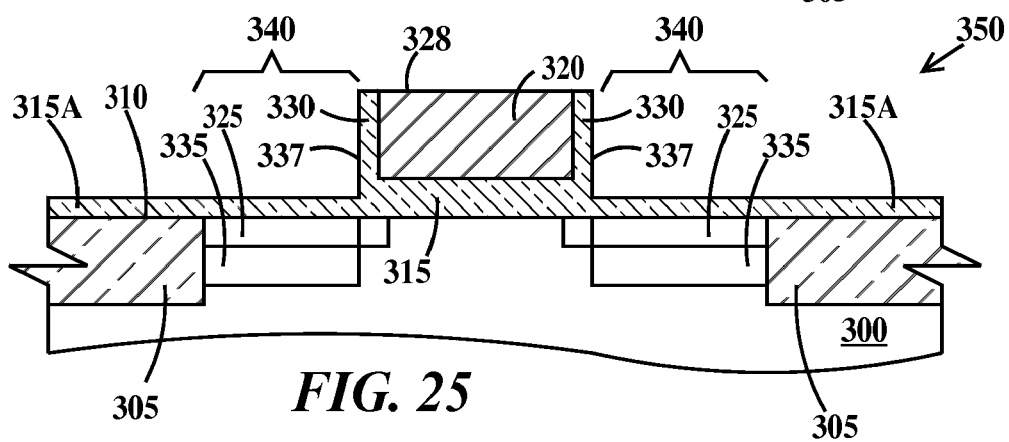

In FIG. 25, a second ion implantation of a second dopant species is performed to form second doped regions 335 in substrate 300. A portion of the perimeters of second doped regions 335 abut STI 305 and remaining portions of the perimeters of second doped regions 335 are essentially aligned (before any anneal steps and disregarding ion implantation straggle) to sidewalls 337 of sidewall layers 330. The second ion implantation may penetrate into mandrel 320 or mandrel 320 may including a capping layer (not shown) on a top surface 328 of the mandrel that blocks the second dopant species from penetrating into the mandrel.

First and second doped regions 325 and 335 form source drains 240 of an FET 350, with mandrel 320 being the gate electrode and dielectric layer 315 being the gate dielectric of the FET.

Thus the embodiments of the present invention provide methods for forming small geometry features that potentially have sub-lithographic dimensions, methods for forming sidewall layers having potentially sub-lithographic dimensions and methods for forming devices having potentially sub-lithographic dimensions The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
   forming a source layer on a top surface of a substrate;
   forming a mandrel on a top surface of said source layer, said mandrel having a sidewall;
   sputtering material from said source layer onto said sidewall of said mandrel to form a sidewall layer on said sidewall of said mandrel; and
   removing said mandrel.

2. The method of claim 1, further including:
   removing any remaining source layer not protected by said sidewall layer.

3. The method of claim 2, further including:
   etching a pattern into said substrate where said substrate is not protected by said sidewall layer; and
   removing said sidewall layer.

4. The method of claim 1, wherein, after said sputtering material from said source layer a thinned layer of source layer remains on said top surface of said substrate adjacent to said sidewall layer.

5. The method of claim 1, wherein said sidewall of said mandrel is about perpendicular to said top surface of said substrate.

6. The method of claim 1, wherein said sidewall of said mandrel is within about 10° of perpendicular to said top surface of said substrate.

7. The method of claim 1, wherein a width of said sidewall layer measured perpendicularly from said sidewall of said mandrel is a sub-lithographic dimension.

8. The method of claim 1, wherein:
   said source layer comprises a lower layer on said top surface of said substrate and an upper layer on a top surface of said lower layer; and
   said sidewall layer comprises a first layer on said sidewall of said mandrel and a second layer on said first layer, said first layer comprising a first same material as said upper layer and said second layer comprising a second same material as said lower layer.

9. A method comprising:
   forming a source layer on a top surface of a substrate;
   forming a photoresist layer on a top surface of said source layer;
   exposing said photoresist layer to actinic radiation through a patterned photomask and developing said photoresist layer to form a photoresist mandrel on said top surface of said source layer, said mandrel having a first sidewall opposite a second sidewall and a third sidewall opposite a fourth sidewall;
   sputtering material from said source layer onto said first, second, third and fourth sidewalls of said mandrel to form first, second, third and fourth sidewall layers on said first, second, third and fourth sidewalls of said mandrel, respectively;
   removing said mandrel; and
   removing said third and fourth sidewall layers.

10. The method of claim 9, further including:
    removing any remaining source layer not protected by said first and second sidewall layers.

11. The method of claim 10, further including:
    etching a pattern into said substrate where said substrate is not protected by said first and second sidewall layers; and
    removing said first and second sidewall layers.

12. The method of claim 9, wherein said first, second, third and fourth sidewalls of said mandrel are about perpendicular to said top surface of said substrate.

13. The method of claim 9, wherein a width of said first, second, third and fourth sidewall layers measured perpendicularly respectively from said first, second, third and fourth sidewalls of said mandrel are sub-lithographic dimensions.

14. A method comprising:
    forming a source layer on a top surface of a substrate;
    forming photoresist layer on a top surface of said source layer;
    exposing said photoresist layer to actinic radiation through a patterned half-tone photomask and developing said photoresist layer to form a photoresist mandrel on a top surface of said source layer, said mandrel having a first sidewall opposite a second sidewall and first and second opposite tapered ends;
    sputtering material from said source layer onto said first and second sidewalls of said mandrel to form first and second sidewall layers on said first and second sidewalls of said mandrel but not on said first and second tapered ends; and
    removing said mandrel.

15. The method of claim 14, wherein said tapered ends taper from a full thickness of said mandrel to a less than said full thickness of said mandrel toward a periphery of said mandrel.

16. The method of claim 14, further including:
    removing any remaining source layer not protected by said first and second sidewall layers.

17. The method of claim 16, further including:
    etching a pattern into said substrate where said substrate is not protected by said first and second sidewall layers; and
    removing said first and second sidewall layers.

18. The method of claim 14, wherein:
    said first, second, third and fourth sidewalls of said mandrel are about perpendicular to said top surface of said substrate; and
    a width of said first, second, third and fourth sidewall layers measured perpendicularly respectively from said first, second, third and fourth sidewalls of said mandrel are sub-lithographic dimensions.

19. A method, comprising:
    forming an electrically conductive source layer on a top surface of a substrate;
    forming a mandrel on a top surface of said source layer, said mandrel having a first sidewall opposite a second sidewall and a third sidewall opposite a fourth sidewall;

sputtering material from said source layer onto said first, second, third and fourth sidewalls of said mandrel to form an electrically conductive liner on said first, second, third and fourth sidewalls of said mandrel, said liner including regions of said source layer under said mandrel;

forming a dielectric layer on said substrate;

planarizing said dielectric layer so a top surface of said dielectric layer is coplanar with a top surface of said mandrel;

removing said mandrel to form a trench surrounded by said liner; and filling said trench with an electrical core conductor.

20. The method of claim 19, further including:

between said sputtering and said forming said dielectric layer, removing any remaining source layer from said top surface of said substrate where said remaining source layer is not protected by said mandrel and said liner.

21. The method of claim 19, wherein said filling said space with an electrical core conductor includes:

depositing a seed layer on exposed surfaces of said dielectric layer and liner;

electroplating a layer of a core conductor material onto said seed layer; and planarizing said layer of said core conductor material so a top surface of said dielectric layer is coplanar with a top surface of said core conductor.

22. The method of claim 19, wherein a width of said liner measured perpendicularly from any of said first, second, third or fourth sidewalls of said mandrel is a sub-lithographic dimension.

23. A method, comprising:

forming a dielectric source layer on a top surface of a substrate;

forming a polysilicon gate electrode on a top surface of said source layer, said gate electrode having a first sidewall opposite a second sidewall;

performing a first ion implantation of a first dopant species into said substrate to form a first doped region in said substrate on a first side of said gate electrode and a second doped region on a second side of said gate electrode;

sputtering material from said source layer onto said first and second sidewalls of said gate electrode to form respective first and second sidewall layers on said first and second sidewalls of said gate electrode; and performing a second ion implantation of a second dopant species into said substrate to form a third doped region in said substrate on said first side of said gate electrode and a fourth doped region on said second side of said gate electrode.

24. The method of claim 23, wherein a distance between said first and second doped regions is less than a distance between said third and fourth doped regions.

25. The method of claim 23, wherein a width of said first sidewall layer measured perpendicularly from said first sidewall of said gate electrode is a sub-lithographic dimension and a width of said second sidewall layer measured perpendicularly from said second sidewall of said gate electrode is a sub-lithographic dimension.

* * * * *